United States Patent
Chen

(10) Patent No.: US 8,624,391 B2
(45) Date of Patent: Jan. 7, 2014

(54) CHIP DESIGN WITH ROBUST CORNER BUMPS

(75) Inventor: Hsien-Wei Chen, Sinying (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 544 days.

(21) Appl. No.: 12/842,731

(22) Filed: Jul. 23, 2010

(65) Prior Publication Data

US 2011/0084390 A1   Apr. 14, 2011

Related U.S. Application Data

(60) Provisional application No. 61/249,902, filed on Oct. 8, 2009.

(51) Int. Cl.
*H01L 23/48* (2006.01)
(52) U.S. Cl.
USPC .... 257/737; 257/178; 257/738; 257/E23.021; 257/E21.508

(58) Field of Classification Search
USPC .......... 257/178, 737, 738, E23.021, E21.058; 438/613
See application file for complete search history.

(56) References Cited

U.S. PATENT DOCUMENTS

| 2003/0218243 A1* | 11/2003 | Chen ............................ 257/734 |
| 2007/0205520 A1* | 9/2007 | Chou et al. ................... 257/780 |
| 2009/0011539 A1 | 1/2009 | Jeng et al. |

* cited by examiner

*Primary Examiner* — A. Sefer
*Assistant Examiner* — Farid Khan
(74) *Attorney, Agent, or Firm* — Slater & Matsil, L.L.P.

(57) ABSTRACT

An integrated circuit structure includes a semiconductor chip, which includes a corner, a side, and a center. The semiconductor chip further includes a plurality of bump pad structures distributed on a major surface of a substrate; a first region of the substrate having formed thereon a first bump pad structure having a first number of supporting metal pads associated with it; and a second region of the substrate having formed thereon a second bump structure having a second number of supported metal pads associated with it, the second number being greater than the first number.

17 Claims, 8 Drawing Sheets

CHIP DESIGN WITH ROBUST CORNER BUMPS

This application claims the benefit of U.S. Provisional Application Ser. No. 61/249,902, filed on Oct. 8, 2009, entitled "Chip Design with Robust Corner Bumps," which application is hereby incorporated herein by reference.

TECHNICAL FIELD

This disclosure relates generally to integrated circuits, and more particularly to the structure and formation methods of bump pad structures of integrated circuits.

BACKGROUND

Integrated circuit (IC) chips are often electrically connected to package substrates in packaging assemblies to provide external signal exchange. A commonly used bonding scheme is flip-chip bonding. FIG. 1 schematically illustrates a flip-chip bonding structure, wherein IC chip 100 is bonded onto package substrate 102 through bump balls 104. It was commonly observed, however, that the coefficient of thermal expansion (CTE) of IC chip 100 is significantly different from that of package substrate 102. For example, the CTE of IC chip 100 may be about 3 ppm/° C., while the CTE of package substrate 102 may be about 15 ppm/° C. Due to the difference in CTEs, stresses are generated inside IC chip 100 and package substrate 102, resulting in a warpage, as is schematically illustrated in FIG. 2.

The warpage results in the crack of bump balls 104 and the delamination of low-k dielectric layers (not shown) in IC chip 100. Currently, many processes use low-k and ultra low-k dielectric materials in inter-metal dielectric (IMD) layers to reduce RC delay and parasitic capacitances. The general trend in IMD designs is that the dielectric constants (k) of the IMD layers tend to decrease from low-k regime to ultra low-k regime. This means that the IMD layers, in which metal lines and vias are formed, are more mechanically fragile. Further, the IMD layers may delaminate when under the stress caused by the thermal expansion. The bump crack and delamination are particularly severe at the corners of IC chip 100. Conventionally underfill is used to fill the space between IC chip 100 and bump balls 104 in order to protect bump balls 104, although bump cracks and delamination were still observed.

SUMMARY

In accordance with one aspect of the embodiment, an integrated circuit structure includes a plurality of bump pad structures distributed on a major surface of a substrate; a first region of the substrate having formed thereon a first bump pad structure having a first number of supporting metal pads associated with it; and a second region of the substrate having formed thereon a second bump structure having a second number of supported metal pads associated with it, the second number being greater than the first number.

Other embodiments are also disclosed.

BRIEF DESCRIPTION OF THE DRAWINGS

For a more complete understanding of the disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts.

Figure 1:
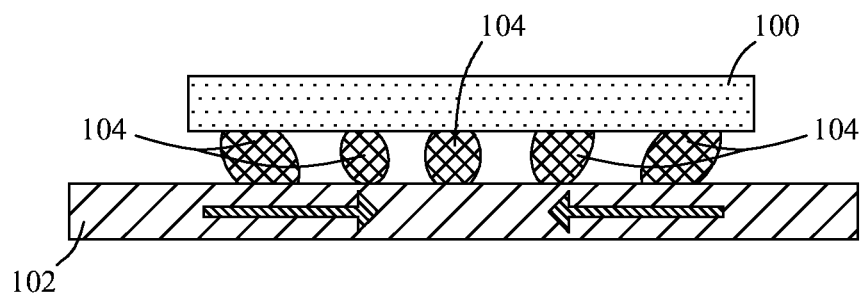
FIGS. 1 and 2 illustrate cross-sectional views of a conventional flip-chip package assembly.
Figure 2:
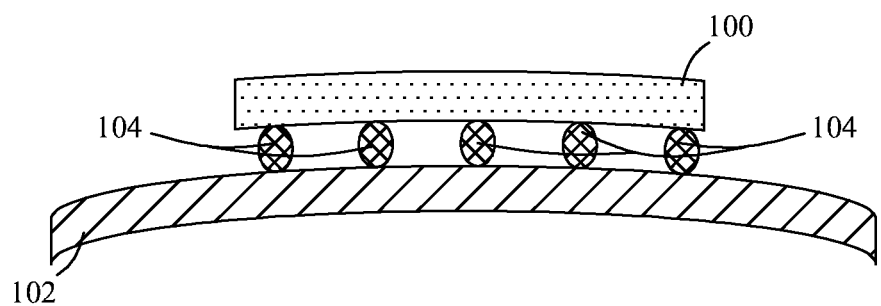
Figure 3A:
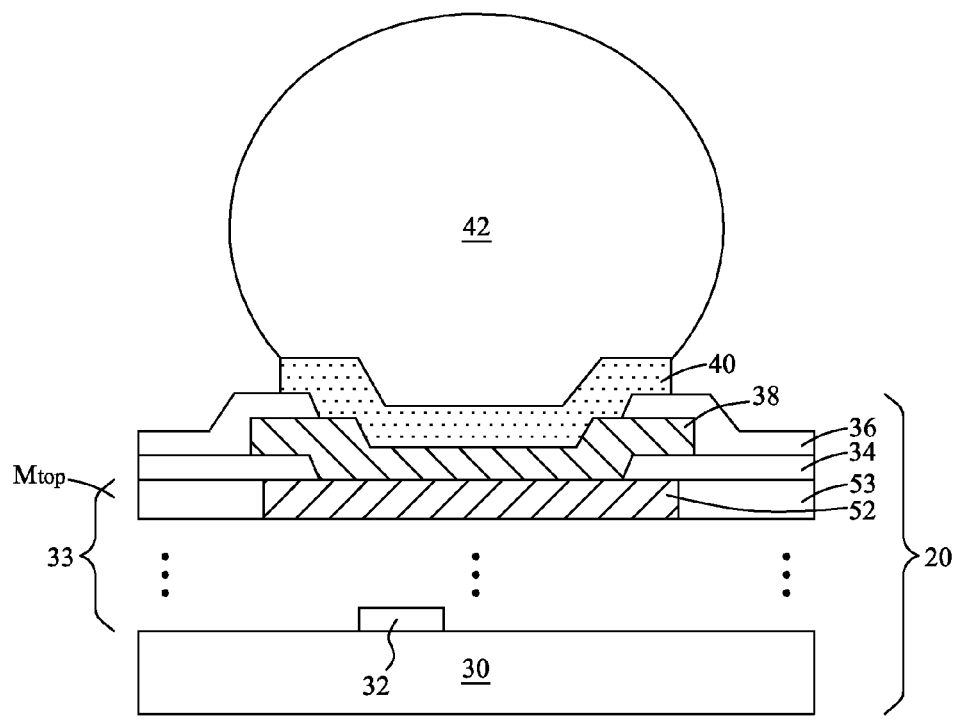
FIGS. 3A, 3B, and 3C are cross-sectional views of a single-solid pad structure, a double-solid pad structure, and a triple-solid pad structure, respectively.
Figure 3B:
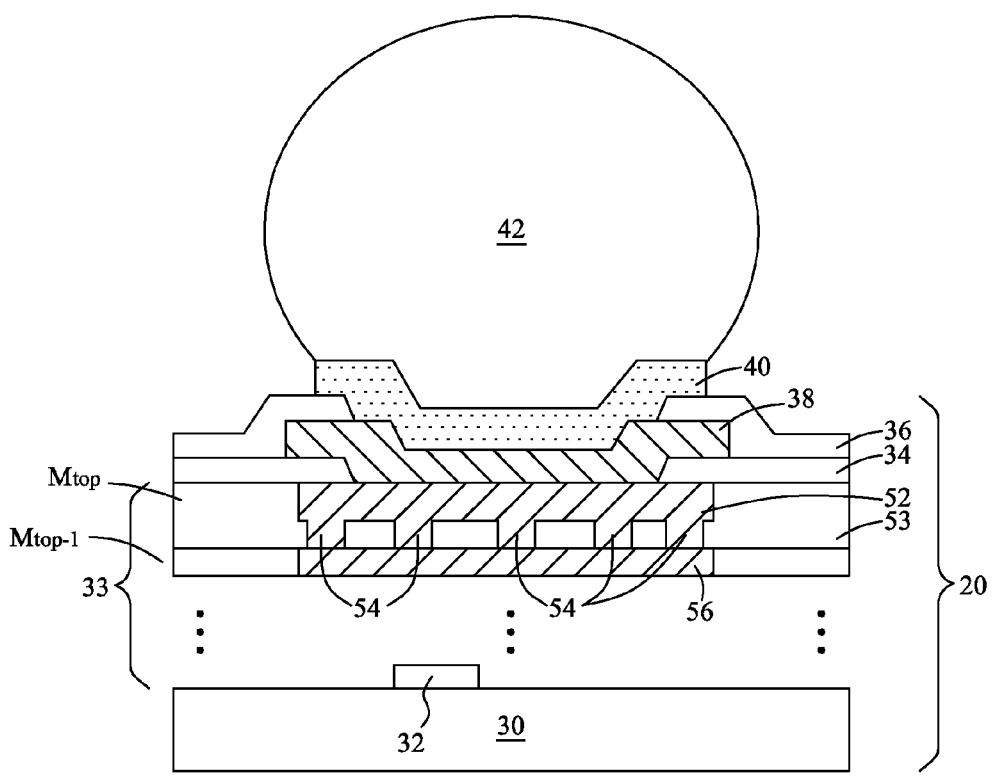
Figure 3C:
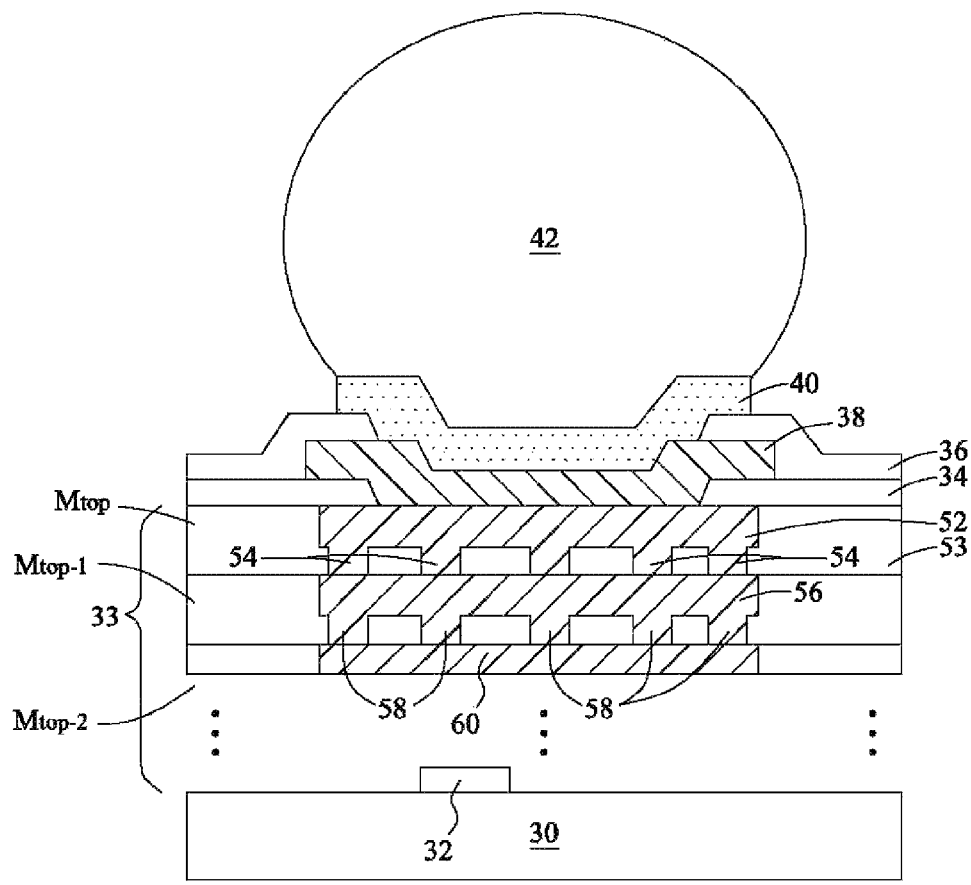

A semiconductor chip may include a plurality of solder bumps, which are used to electrically connect the integrated circuits in the semiconductor chip to external circuits. FIGS. 3A, 3B, and 3C illustrate exemplary bump pad structures, on which bumps 42 are formed, in accordance with an embodiment. Throughout the description, the term "bump pad structure" refers to the structures, including UBM 40, metal pad 38, the underlying pads 56 and 60 (and additional supporting pads, if any, please refer to FIGS. 3A through 3C), and the connecting vias.

FIG. 3A illustrates a cross-sectional view showing a portion of chip 20, which includes substrate 30, on which active circuit 32 is formed. Substrate 30 may be a semiconductor substrate formed of commonly used semiconductor materials, such as silicon, silicon germanium, or the like. Active circuit 32 may include complementary metal-oxide-semiconductor (CMOS) transistors, resistors, capacitors, and the like. Interconnect structure 33 is formed over active circuit 32 and is used to interconnect portions of active circuit 32, and to connect active circuit 32 to bump 42. Interconnect structure 33 includes a plurality of metallization layers comprising metal lines and vias (not shown) in a plurality of dielectric layers. The dielectric layers in interconnect structure 33 may be low-k dielectric layers.

Passivation layers 34 and 36 are formed over interconnect structure 33. Passivation layers 34 and 36 are commonly referred to in the art as being passivation-1 and passivation-2, respectively, and may be formed of materials, such as silicon oxide, silicon nitride, un-doped silicate glass (USG), polyimide, and/or multi-layers thereof. Metal pad 38 may have a lower portion in passivation layer 34. Further, metal pad 38 may have an upper portion level with a lower portion of passivation layer 36 and directly underlying an opening in an upper portion of passivation layer 36. Metal pad 38 may comprise aluminum, and hence may also be referred to as aluminum pad 38, although it may also be formed of, or include, other materials, such as copper, silver, gold, nickel, tungsten, alloys thereof, and/or multi-layers thereof. In an embodiment, metal pad 38 is formed of Al—Cu. Metal pad 38 may be electrically connected to active circuit 32, for example, through underlying interconnection structure 33.

An opening is formed in passivation layer 36. Under-bump metallurgy (UBM) 40 fills the opening and contacts metal pad 38. In an embodiment, UBM 40 is formed of a composite layer comprising a titanium layer, a copper layer, a nickel layer, or combinations thereof. In other embodiments, UBM 40 may include other metals, such as gold. UBM 40 may include a portion in passivation layer 36 and portions over passivation layer 36.

Bump 42 is formed over and electrically connected to, and possibly contacting, UBM 40. Bump 42 may be formed of a eutectic solder, a lead-free solder, copper, copper-containing alloy, or the like. In an embodiment, bump 42 is formed of a solder material, a re-flow is performed on bump 42, thus bump 42 has a spherical upper portion, with the size and the shape of the lower portion being defined by the size and the shape of UBM 40, respectively.

The metallization layers in interconnect structure 33 include a top metallization layer Mtop, which includes top dielectric layer 53, and Mtop pad 52 in top dielectric layer 53. Top dielectric layer 53 may be formed of un-doped silicate glass or low-k dielectric materials. Mtop pad 52 may either contact metal pad 38 directly, as shown in FIG. 3A, or connected to metal pad 38 through multiple vias (not shown, similar to vias 54 in FIG. 3B) that contacts both metal pad 38 and Mtop pad 52. The bump pad structure shown in FIG. 3A is referred to as a single-solid pad structure since there is only a single metal pad, Mtop pad 52, directly under metal pad 38. Throughout the description, the metal pads that are directly under and connected to metal pad 38, either directly or through a plurality of vias, are referred to as supporting metal pads. Accordingly, metal pads 52, 56 and 60 (FIGS. 3B and 3C) are supporting metal pads. It is realized that when a force is applied to metal pad 38, the force will be imparted to Mtop pad 52 and underlying supporting metal pads, if any, and hence the likelihood of having bump cracking and low-k dielectric layers is reduced. In FIG. 3A, no additional supporting metal pads are directly under Mtop pad 52.

Figure 4:
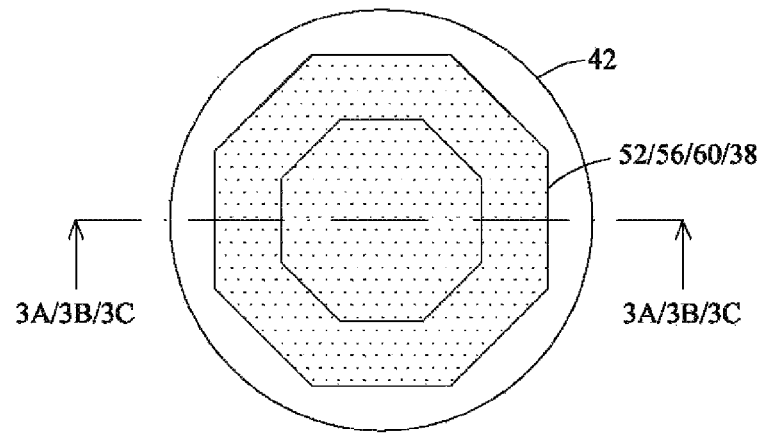
FIG. 4 illustrates a top view of the structure shown in FIGS. 3A, 3B, and/or 3C.

FIG. 3B illustrates a double-solid pad structure. The structure shown in FIG. 3B is similar to what is shown in FIG. 3A, except that there is an additional Mtop-1 pad 56 directly under Mtop pad 52. Mtop-1 pad 56 is formed in metallization layer Mtop-1, which is immediately under top metallization layer Mtop. Mtop-1 pad 56 and Mtop pad 52 are connected through a plurality of vias 54. Mtop-1 pad 56 and Mtop pad 52 may have significant portions overlapping each other. In an embodiment, as shown in FIG. 4, Mtop-1 pad 56 and Mtop pad 52 may have a same size and a same shape, and may (or may not) fully overlap each other. It is realized that when a force is applied to metal pad 38, the force will be imparted to Mtop-1 pad 56 through Mtop pad 52, and hence Mtop-1 pad 56 also structurally supports metal pad 38. No additional supporting metal pads are directly under metal pad 56.

FIG. 3C illustrates a triple-solid pad structure. The structure shown in FIG. 3C is similar to what is shown in FIG. 3B, except that there is an additional Mtop-2 pad 60 directly under Mtop-1 pad 56. Mtop-2 pad 60 is formed in metallization layer Mtop-2, which is immediately under metallization layer Mtop-1. Mtop-1 pad 56 and Mtop-2 pad 60 are connected through a plurality of vias 58. Mtop-1 pad 56, Mtop pad 52, and Mtop-2 pad 60 may have significant portions overlapping each other, as also shown in FIG. 4. In an embodiment, metal pads 52, 56, and 60 have a same size and a same shape, and may (or may not) fully overlap each other. No additional supporting metal pads are directly under metal pad 60 and connected to Mtop-2 pad 60 through vias.

FIG. 4 illustrates a top view of the structure shown in FIG. 3A, wherein the cross-sectional view of FIGS. 3A, 3B, and/or 3C are taken along a plane crossing line 3A/3B/3C-3A/3B/3C in FIG. 4.

In alternative embodiments, one, two, or even three additional supporting metal pads may be formed directly under Mtop-2 pad 60, and structurally bonded to Mtop-2 pad 60 through vias. One skilled in the art will realize the respective structures by applying the teaching provided in preceding paragraphs.

Figure 5:
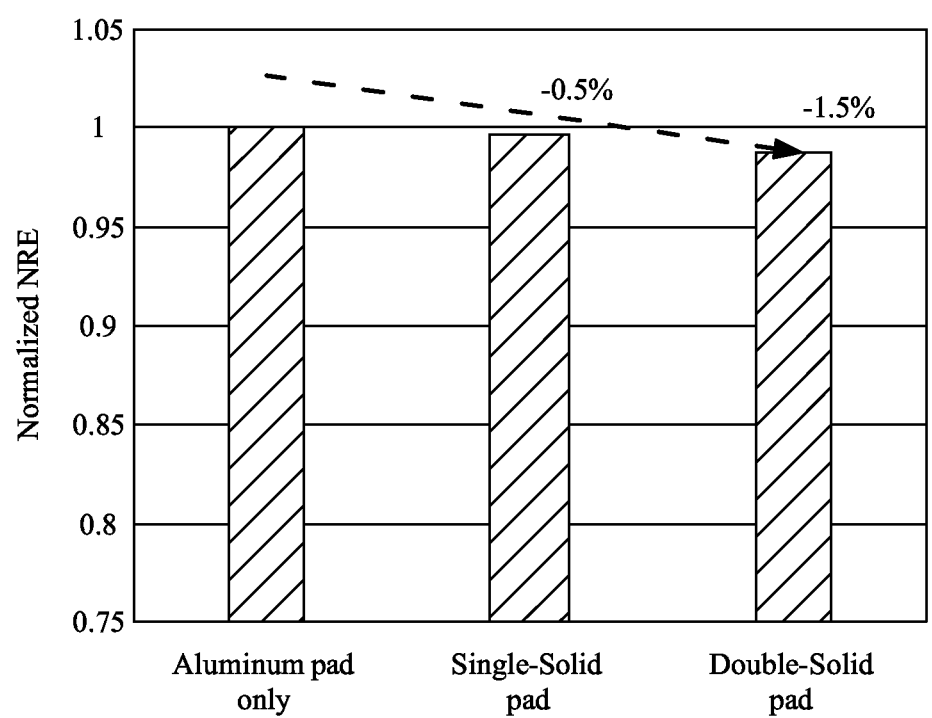
FIG. 5 illustrates simulation results, wherein node release energies of different bump pad structures are related to the number of respective supporting metal pads.

Simulations were made to study the node release energies (NREs) of bump pad structures as shown in FIGS. 3A, 3B, and 3C. An NRE of a bump pad structure is equal to the force applied on the feature times the displacement of the bump pad structure. Greater NREs indicate greater displacements of the bump pad structure, and hence greater possibility of delamination and bump cracking The simulation results are illustrated in FIG. 5, wherein the Y-axis indicates the NREs, and the X-axis indicates the types of bump pad structures. The notation "Aluminum pad only" represents a structure not having Mtop pad 52 underlying metal pad 38, while notations "single-solid pad" and "double-solid pad" represent the structures shown in FIGS. 3A and 3B, respectively. The simulation results have revealed that when the number of supporting metal pads increases, the NRE of the respective bump pad structure decreases, which means that the respective semiconductor chip suffers less from cracking and delamination, and hence is more reliable. It is noted that if the number of supporting metal pads further increases, the stress that may be applied to metal pad 38 and low-k dielectric layers are better distributed, and the respective semiconductor chip 20 will be more reliable.

Figure 6:
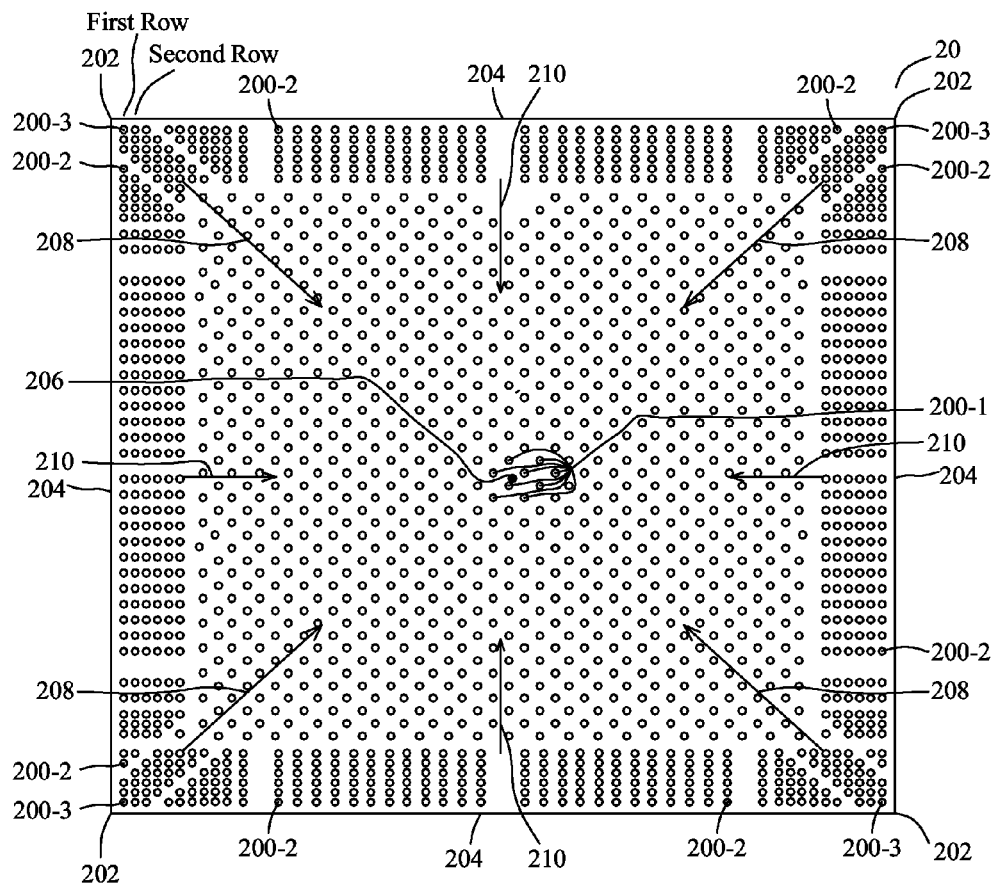
FIG. 6 illustrates a top view of a chip with bump pad structures in accordance with an embodiment.

FIG. 6 illustrates a top view of chip 20, wherein a plurality of bump pad structures are illustrated. The bump pad structures are shown as small hollow circles and are shown as bump pad structures 200-1, 200-2, and 200-3 (also refer to FIGS. 7 through 10). Bump pad structures 200-1 are single-solid pad structures and correspond to the structure shown in FIG. 3A. Bump pad structures 200-2 are double-solid pad structures and correspond to the structure shown in FIG. 3B. Bump pad structures 200-3 are triple-solid pad structures and correspond to the structure shown in FIG. 3C. Chip 20 includes four corners 202 and four sides 204. The center of chip 20 is denoted as center 206. In the corner-to-center directions (symbolized by arrows 208), the stresses exerted on bump pad structures 200 decrease. Further, in the side-to-center directions (symbolized by arrows 210), the stresses exerted on bump pad structures 200 also decrease. Accordingly, to improve the reliability of chip 20, the bump pad structures with greater numbers of supporting metal pads may be used at locations (such as corners) suffering from greater stresses, while the bump pad structures with fewer numbers of supporting metal pads may be used at locations (such as the center of chip 20) suffering from smaller stresses. The added supporting metal pads have the function of ameliorating stresses, for example, distributing the stresses to more layers and more features, so that the likelihood of excess stress being applied on metal pad 38 is reduced. It is appreciated that while the method of adding supporting metal pads is disclosed, other stress ameliorating structures are also within the contemplated scope of the disclosure.

Figure 7:
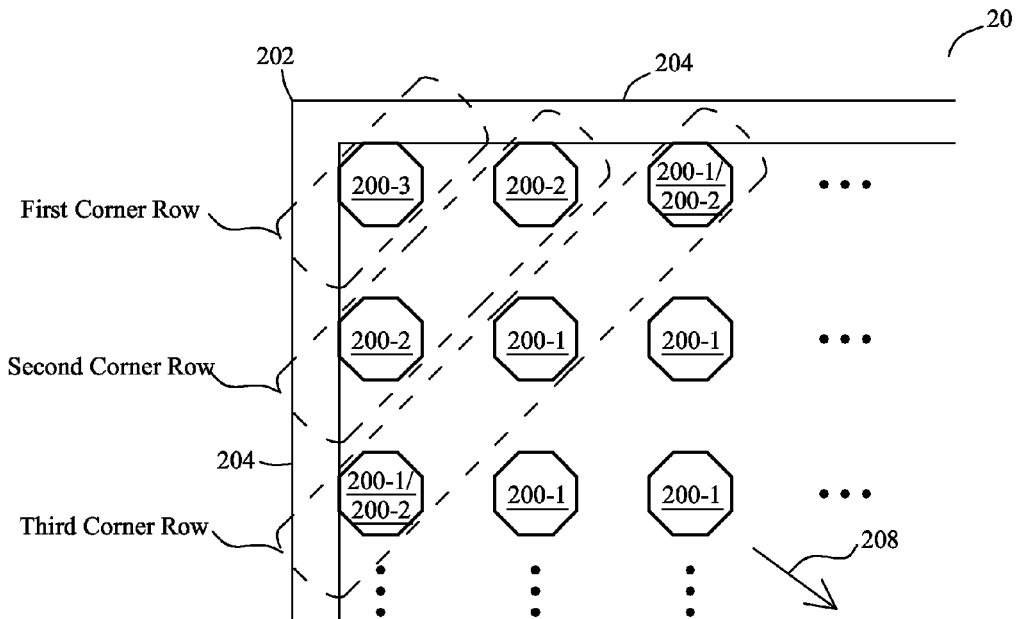
FIGS. 7 and 8 illustrate corner portions of chips and corner-rows of bump pad structures.
Figure 8:
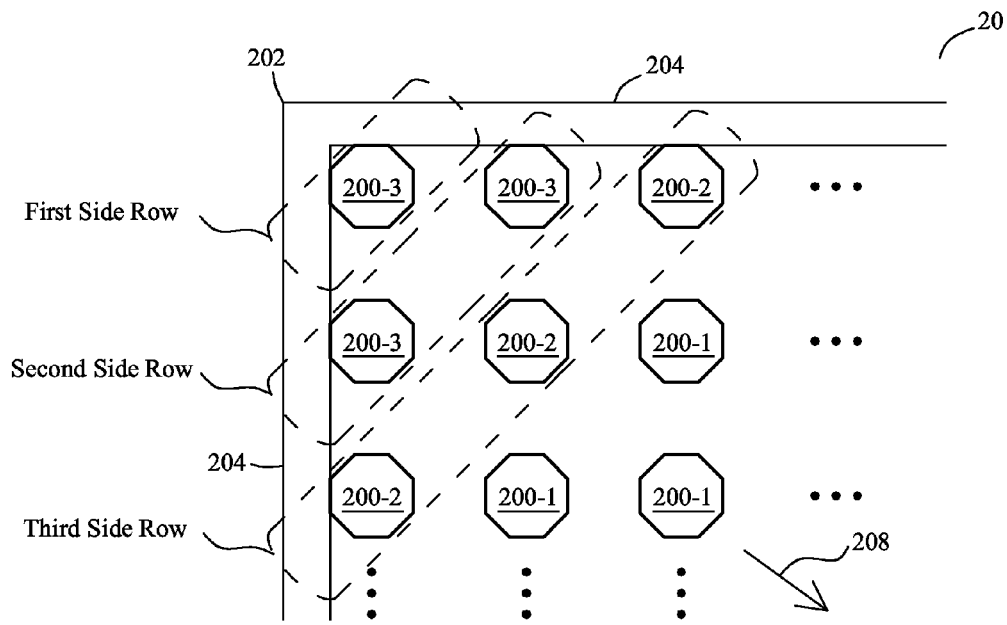

FIG. 7 illustrates a corner portion of chip 20. In an embodiment, in the corner-to-center direction 208, bump pad structures 200 are divided into corner-rows, with the corner-rows closer to the respective corner 202 having a greater number of supporting metal pads, while the corner-rows farther away from the respective corner 202 having a fewer number of supporting metal pads. In an exemplary embodiment, only the first corner-row (with only one bump pad structure 200-3) has the triple-solid pad structure. The second corner-row (with two bump pad structure 200-2) has the double-solid pad structure. The third corner-row (with three bump pad structure 200-1) has the single-solid pad structure. Please note that bump pad structures denoted as "200-1/200-2" may be single-solid pads structures or double-solid pad structures due to the fact that they are in the first side-rows, as will be discussed in subsequent paragraphs. All other corner-rows that are closer to the center 206 of chip 20 (refer to FIG. 6) may have the single-solid pad structures. It is also realized that from the corner 202 to center 206 (refer to FIG. 6) of chip 20, the desirable number of corner-rows of triple-solid pad structures and/or the number of corner-rows of double-solid pad structures may be greater than one. For example, in FIG. 8, there are two corner-rows of triple-solid pad structures 200-3. However, it is still desirable that bump pad structures in the corner-rows closer to center 206 will not have a greater number of supporting metal pads than that in the corner-rows farther away from center 206.

Referring back to FIG. 6, it is observed that the stresses applied to the bump pad structures 200 close to sides 204 of chip 20 are between the stresses applied to the bump pad structures 200 close to corner 202 and the stresses applied to the bump pad structures 200 close to center 206. Therefore, in the side-to-center direction, bump pad structures 200 are divided into side-rows that are parallel to respective sides 204, with the side-rows closer to the respective sides 204 having a greater number of supporting metal pads, while the side-rows farther away from the respective sides 204 having a fewer number of supporting metal pads. In an exemplary embodiment, only the first side-row has the double-solid pad structure. All other rows that are closer to center 206 of chip 20 (refer to FIG. 6) than the first side-row may have single-solid pad structures. In alternative embodiments, the number of side-rows having double-solid pad structures may be greater than one, depending on the magnitude of the stresses. However, it is still desirable that bump pad structures in the side-rows closer to center 206 will not have a greater number of supporting metal pads than that in the side-rows farther away from center 206.

The stress applied to corners 202 of chip 20 depends on the size of chip 20 and the material (and hence the mechanical strength) of bump 42. Accordingly, if chip 20 is small, fewer triple-solid pad structures may be used. Experiment results have revealed that if chip 20 has an area smaller than about 100 mm$^2$, only one triple-solid pad structure is needed at each corner 202. Since triple-solid pad structures have a greater area penalty than double-solid pad structures, and double-solid pad structures have a greater area penalty than single-solid pad structures, reducing the number of triple-solid pad structures and double-solid pad structures may reduce the area penalty. However, the reduction in the number of triple-solid pad structures and double-solid pad structures can only be achieved without sacrificing the reliability of chip 20. An optimum number of triple-solid pad structures and an optimum number of double-solid pad structures thus need to be found.

Figure 9:
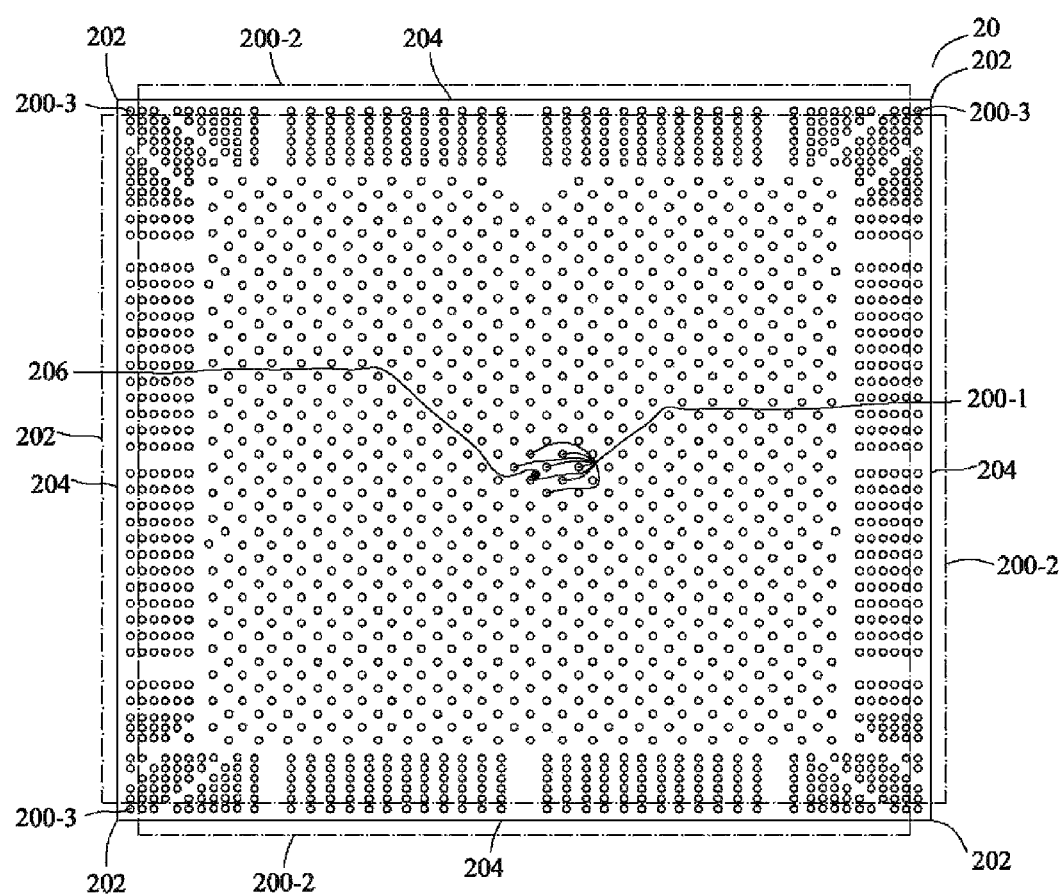
FIGS. 9 and 10 illustrate top views of chips in accordance with alternative embodiments, wherein side-rows of bump pad structures are illustrated.
Figure 10:
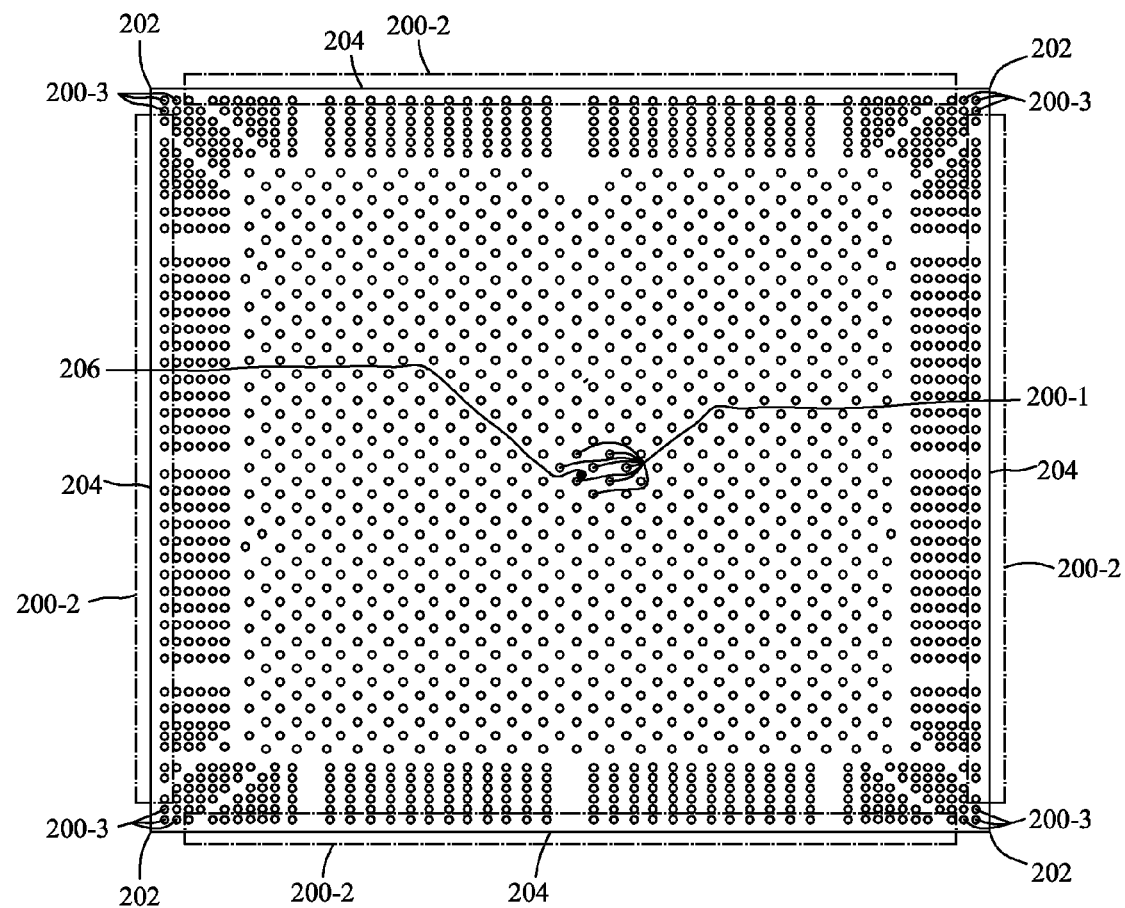

FIGS. 9 and 10 illustrate exemplary embodiments with different number of triple-solid pad structures at the corners. In both FIGS. 9 and 10, there is at least one triple-solid pad structure 200-3 at each corner 202. Referring to FIG. 9, there is one side-row of double-solid pad structures 200-2 (shown as inside dotted rectangles 200-2) along each side of chip 20, wherein corner bump pads structures 200-3 are not considered as being in the side-rows throughout the description. All remaining pad structures in chip 20 are single-solid pad structures. An exemplary chip having three triple-solid pad structures 200-3 at each corner 202 is shown in FIG. 10. There may be one side-row of double-solid pad structures 200-2 along each side of chip 20, and one corner-row of double-solid pad structures 200-2 at each corner. All remaining pad structures in chip 20 are single-solid pad structures. If the area of chip 20 is between about 100 mm$^2$ and about 225 mm$^2$, there may be one triple-solid pad structure 200-3 at each corner 202 if bumps 42 are eutectic bumps (FIG. 9), and there may be three triple-solid pad structure 200-3 at each corner 202 if bumps 42 are lead-free bumps (FIG. 10). If the area of chip 20 is greater than about 225 mm$^2$, there may be three triple-solid pad structure 200-3 at each corner 202 (FIG. 10) regardless whether bumps 42 are eutectic bumps or lead-free bumps. Further increasing the size of chip 20, the desirable number of triple-solid pad structures and the desirable number of double-solid pad structures may also further increase.

The embodiments have several advantageous features. The integration of single-solid pad structures, double-solid pad structures, and triple-solid pad structures in a same chip significantly improves the reliability of the semiconductor chips. However, there are no additional process steps and manufacturing costs involved. The embodiments take into the consideration of the chip size and the bump material, so that optimum effects can be achieved with minimum chip-area penalty.

Although the embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit comprising:
    a plurality of bump pad structures distributed on a major surface of a substrate;
    a first region of the substrate having formed thereon a first bump pad structure having a first number of supporting metal pads associated with it; and
    a second region of the substrate having formed thereon a second bump pad structure having a second number of supporting metal pads associated with it, the second number being greater than the first number, wherein the second region is an edge region of the substrate, and wherein the first region is a center region of the substrate.

2. The integrated circuit of claim 1 further comprising:
    a third region of the substrate having formed thereon a third bump pad structure having a third number of supporting metal pads associated with it, the third number being greater than the second number.

3. The integrated circuit of claim 2, wherein the third region is a corner region.

4. The integrated circuit of claim 1, wherein the substrate is subject to stress asserted thereon and wherein the second region is subject to greater stress than the first region.

5. The integrated circuit of claim 2, wherein a plurality of bump pad structures are formed on the substrate and are logically divided into rows, with at least one row closest to a corner of the substrate having at least one third bump pad structure formed therein, with at least one row closest to an edge of the substrate and having at least one second bump pad structure formed therein, and with at least one row removed from the corner and the edge of the substrate and having at least one first bump pad structure formed therein.

6. The integrated circuit of claim 2, wherein the first number of supporting metal pads is one, the second number of supporting metal pads is two, and the third number of supporting metal pads is three.

7. An integrated circuit comprising:
 a corner;
 an edge;
 a center;
 a first bump pad structure closest to the corner, relative to other bump pad structures, and having a first pad structure, wherein the first bump pad structure comprises a triple-solid pad structure;
 a second bump pad structure closest to the edge, relative to other bump pad structures, and having a second pad structure, wherein the second bump pad structure comprises a double-solid pad structure; and
 a third bump pad structure closest to the center, relative to other bump pad structures, and having a third pad structure, wherein the third bump pad structure comprises a single-solid pad structure.

8. The integrated circuit of claim 7, wherein bump pad structures are organized as rows on the integrated circuit and comprising:
 a first row of bump pad structures adjacent the corner comprising triple-solid pad structures; and
 adjacent the first row of bump pad structures, a second row of bump pad structures comprising double-solid pad structures.

9. The integrated circuit of claim 7, wherein bump pad structures are organized as rows on the integrated circuit and comprising:
 a first row of bump pad structures adjacent the corner comprising double-solid pad structures; and
 adjacent the first row of bump pad structures, a second row of bump pad structures comprising single-solid pad structures.

10. The integrated circuit of claim 7 further comprising a solder bump formed atop and electrically connected to the first bump pad structure.

11. An integrated circuit comprising:
 a substrate having a first region subject to a first stress and a second region subject to a second, higher stress;
 a plurality of bump pads formed on the substrate, the plurality of bump pads including:
 a first bump pad having a first stress ameliorating structure formed in the first region, wherein the first stress ameliorating structure is a single-solid pad; and
 a second bump pad having a second stress ameliorating structure, different from the first stress ameliorating structure, formed in the second region, wherein the second stress ameliorating structure is a double-solid pad.

12. The integrated circuit of claim 11, wherein the substrate further includes a third region subject to a higher stress than the second region, and wherein the plurality of bump pads further includes:
 a third bump pad having a third stress ameliorating structure, different from the first and second stress ameliorating structures, formed in the third region.

13. The integrated circuit of claim 12, wherein:
 the third region is a corner of the substrate;
 the second region is an edge of the substrate; and
 the first region is removed from the corner and the edge of the substrate.

14. The integrated circuit of claim 12, wherein the plurality of bump pads are laid out in rows and wherein:
 bump pads in a row closest to a corner of the substrate include the third stress ameliorating structure;
 bump pads in a row closest to an edge of the substrate include the second stress ameliorating structure; and
 bump pads in a row removed from the corner and the edge of the substrate include the first stress ameliorating structure.

15. The integrated circuit of claim 11, wherein the substrate has a surface area between 100 mm$^2$ and 225 mm$^2$.

16. The integrated circuit of claim 14 having at least three bump pads in the row closest to the corner of the substrate.

17. The integrated circuit of claim 11 further comprising a solder bump formed atop the first bump pad.

* * * * *